United States Patent
Picciotto et al.

(10) Patent No.: US 7,650,029 B2
(45) Date of Patent: Jan. 19, 2010

(54) MULTIPLE LAYER ALIGNMENT SENSING

(75) Inventors: Carl E. Picciotto, Menlo Park, CA (US); Jun Gao, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 804 days.

(21) Appl. No.: 10/995,840

(22) Filed: Nov. 23, 2004

(65) Prior Publication Data

US 2006/0110070 A1    May 25, 2006

(51) Int. Cl.
    *G06K 9/00*    (2006.01)
(52) U.S. Cl. ..................................... 382/144
(58) Field of Classification Search .............. 382/276, 382/282, 283, 286, 291, 293, 294, 295, 144–152; 29/833; 438/16; 348/126; 702/34
See application file for complete search history.

(56) References Cited

U.S. PATENT DOCUMENTS

| | | | |
|---|---|---|---|
| 3,885,877 A * | 5/1975 | Horwath et al. ............. | 356/400 |
| 4,353,087 A * | 10/1982 | Berry et al. .................. | 348/87 |
| 4,952,970 A | 8/1990 | Suzuki et al. | |
| 5,204,739 A | 4/1993 | Domenicali | |
| 5,578,821 A * | 11/1996 | Meisberger et al. ......... | 250/310 |
| 5,694,481 A * | 12/1997 | Lam et al. .................. | 382/145 |
| 5,798,195 A * | 8/1998 | Nishi .......................... | 430/22 |
| 6,222,198 B1 | 4/2001 | Brown | |
| 6,462,818 B1 * | 10/2002 | Bareket ....................... | 356/401 |
| 6,819,789 B1 * | 11/2004 | Kantor et al. ................ | 382/151 |
| 6,842,225 B1 * | 1/2005 | Irie ............................ | 355/67 |
| 6,985,618 B2 * | 1/2006 | Adel et al. .................. | 382/151 |
| 7,013,039 B2 * | 3/2006 | Sugawara .................... | 382/151 |
| 7,062,091 B2 * | 6/2006 | Brown et al. ................ | 382/195 |
| 7,062,354 B2 * | 6/2006 | Ganot et al. ................. | 700/192 |
| 7,136,520 B2 * | 11/2006 | Lan ............................ | 382/151 |
| 7,190,823 B2 * | 3/2007 | Chen ......................... | 382/151 |
| 2003/0174879 A1 * | 9/2003 | Chen ......................... | 382/151 |
| 2004/0021254 A1 | 2/2004 | Sreenivasan et al. | |
| 2004/0141168 A1 | 7/2004 | Sreenivasan et al. | |
| 2006/0110069 A1 * | 5/2006 | Tong et al. .................. | 382/294 |

FOREIGN PATENT DOCUMENTS

EP    1061417 A    12/2000

OTHER PUBLICATIONS

Picciotto, C., et al., "Image Displacement Sensing (NDSE) For Achieving Overlay Alignment"; Applied Physics A (Materials Science Processing) Springer-Verlag Germany; Mar. 2005.
Waser, R., ed., Nanoelectronics and information Technology: Advanced Electronic Materials and Novel Devices, Wiley-VCH Verlag GmbH (2003), pp. 243-244.

* cited by examiner

*Primary Examiner*—Samir A. Ahmed
*Assistant Examiner*—Atiba O Fitzpatrick

(57) ABSTRACT

Using an imaging system in relation to a plurality of material layers is described, the material layers being separated by a distance greater than a depth of field of the imaging system. A focal plane of the imaging system and a first of the plurality of material layers are brought into correspondence. A first image including at least a portion of the first material layer having a first feature of interest thereon is stored. The focal plane of the imaging system and a second of the plurality of material layers are brought into correspondence. A second image including at least a portion of the second material layer having a second feature of interest thereon is acquired. The first and second images are processed for automatic computation of an alignment measurement between the first and second features of interest.

33 Claims, 8 Drawing Sheets

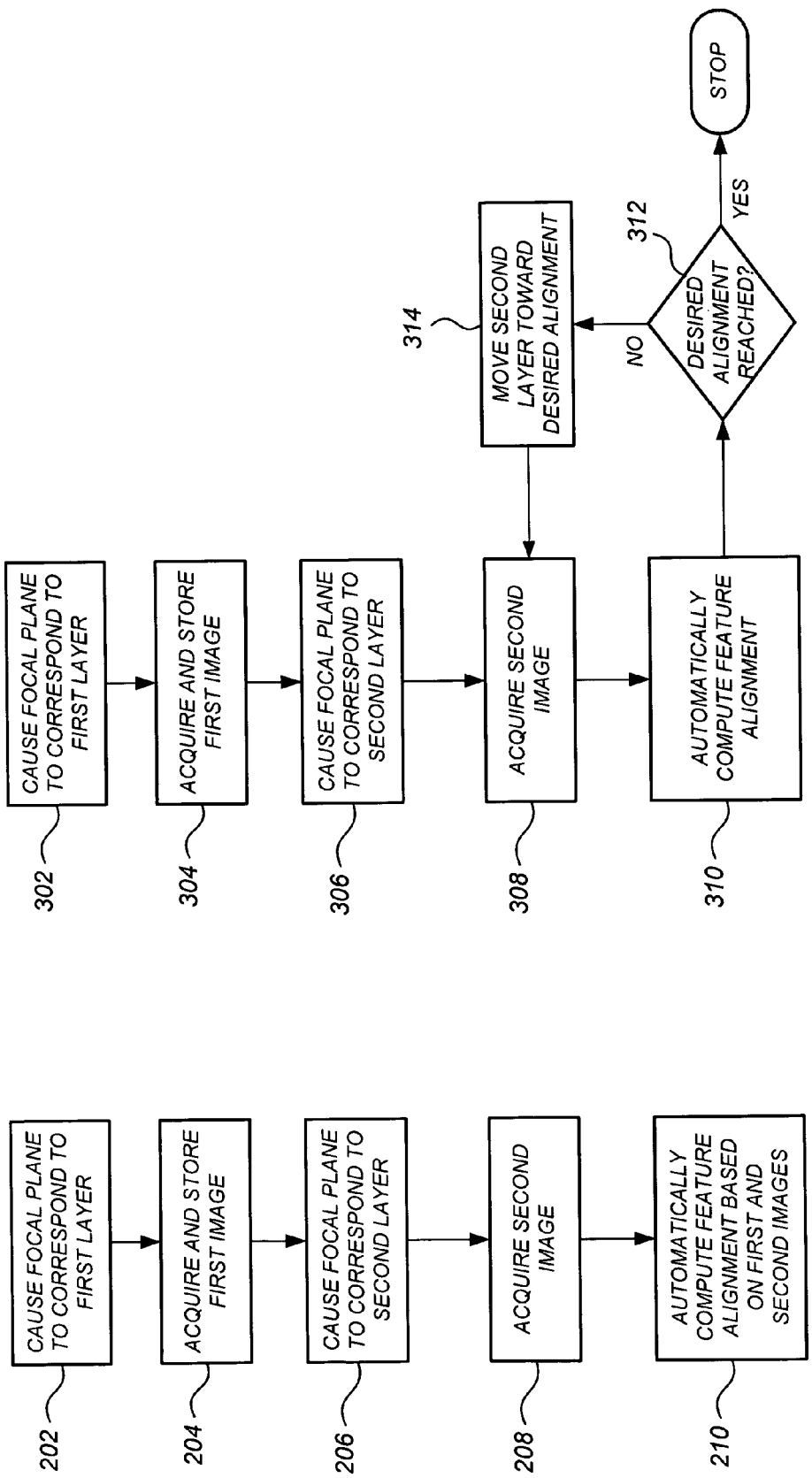

MULTIPLE LAYER ALIGNMENT SENSING

CROSS-REFERENCE TO RELATED APPLICATIONS

The subject matter of this patent specification relates at least in part to the subject matter of U.S. Ser. No. 10/995,837 filed even date herewith (Nov. 23, 2004), and which is incorporated by reference herein.

FIELD

This patent specification relates to at least one of sensing and controlling an alignment of multiple material layers using an imaging system.

BACKGROUND

The generation of small devices often involves an alignment of multiple material layers, e.g., two or more material layers, with the assistance of an imaging system. Alignment requirements generally become more exacting as feature sizes on the devices shrink, requiring imaging systems with increased lateral resolving power. Some degree of spacing between the material layers is generally required during the alignment process. In some contexts this spacing is temporary, as in the case of mask and substrate alignment in semiconductor device fabrication using proximity lithography. In other cases this spacing may be more permanent, as in the generation of micro-electromechanical machine (MEMS) devices, nanostructures, or the like.

Because there is often an inverse relationship between the resolving power and the depth of field of an imaging system, one issue brought about by shrinking feature sizes is that the spacing between material layers may begin to exceed the depth of field of the imaging system used in the alignment process. This can bring about difficulties in proper alignment sensing. This issue can be compounded in the context of more advanced device fabrication techniques or more complex MEMS or nanostructural devices that may require concurrent aligning of more than two material layers. Another issue arising out of these concerns or other aspects of shrinking feature sizes is that it may be frustrating, tiresome, or otherwise undesirable for a human to be involved in the alignment sensing or control process.

SUMMARY

In accordance with an embodiment, a method for using an imaging system in relation to a plurality of material layers is provided, the material layers being separated by a distance greater than a depth of field of the imaging system. A focal plane of the imaging system and a first of the plurality of material layers are brought into correspondence. A first image including at least a portion of the first material layer having a first feature of interest thereon is acquired and stored. The focal plane of the imaging system and a second of the plurality of material layers are brought into correspondence. A second image including at least a portion of the second material layer having a second feature of interest thereon is acquired. The first and second images are processed for automatic computation of an alignment measurement between the first and second features of interest.

Also provided is an apparatus for facilitating lateral positioning of a plurality of layers including a first layer having a first feature of interest and a second layer having a second feature of interest. The apparatus comprises an imaging system having a focal plane and having a depth of field less than a vertical spacing between the first and second layer. The apparatus further comprises a memory storing a first image acquired by the imaging system with the focal plane substantially coincident with the first layer, the first image including the first feature of interest. The processor retrieves the first image from the memory and receives a second image acquired by the imaging system with the focal plane substantially coincident with the second layer, the second image including the second feature of interest. The processor processes the first and second images to automatically compute an alignment state between the first and second features of interest.

BRIEF DESCRIPTION OF THE DRAWINGS

FIG. 2 illustrates alignment sensing according to an embodiment;

FIG. 3 illustrates alignment sensing and controlling according to an embodiment;

DETAILED DESCRIPTION

Figure 1:
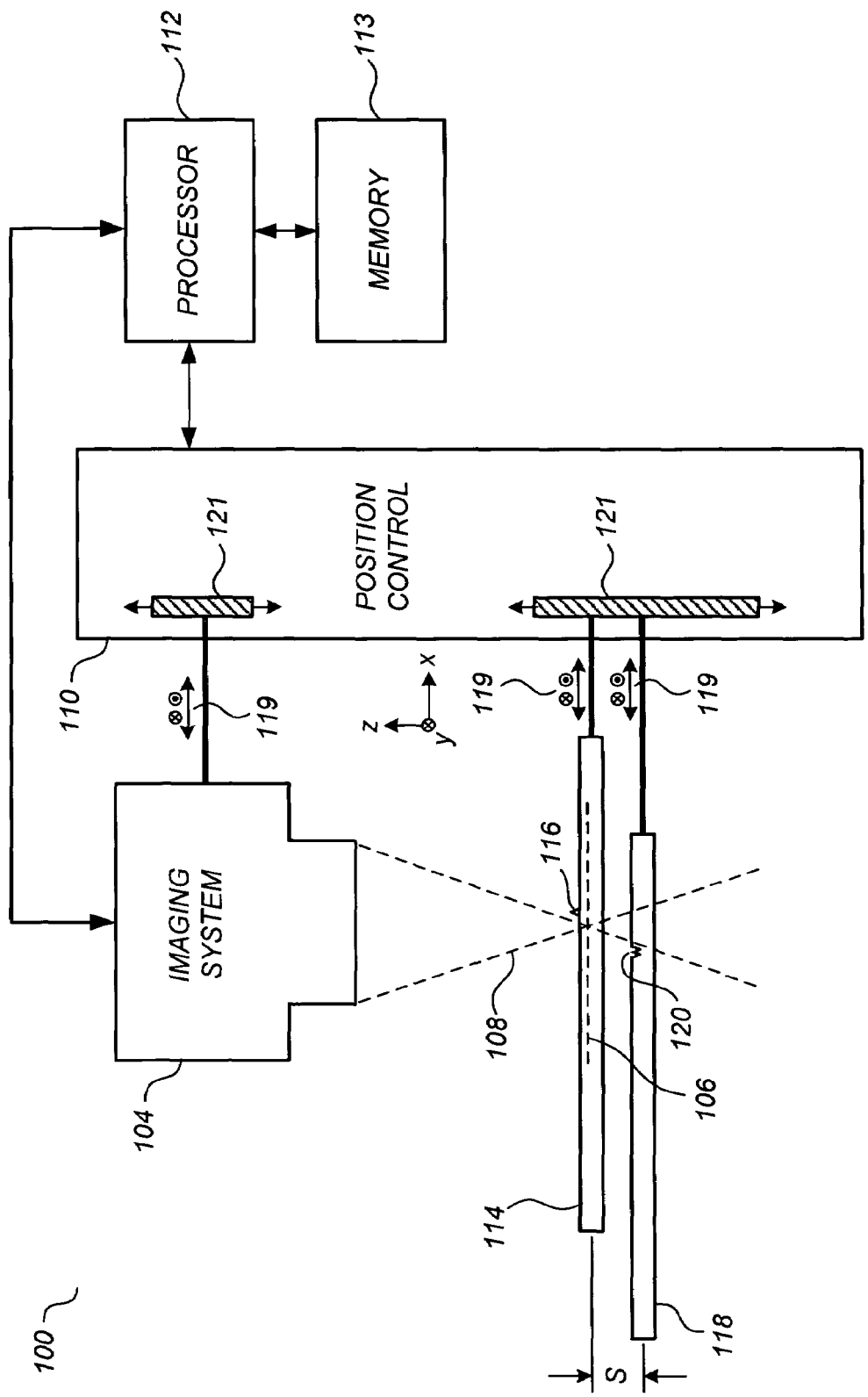
FIG. 1 illustrates an apparatus for at least one of sensing and controlling an alignment of multiple material layers according to an embodiment.

FIG. 1 illustrates an apparatus 100 for at least one of sensing and controlling an alignment of multiple material layers including an upper layer 114 and a lower layer 118 according to an embodiment. Apparatus 100 comprises an imaging system 104 having a depth of field less than a separation distance "S" of the upper layer 114 and lower layer 118.

In one embodiment, which is described by way of illustration and not by way of limitation, the upper layer 114 is a mask and the lower layer 118 is a sample, respectively, in a proximity lithography system requiring submicron alignment tolerances therebetween. The imaging system 104 comprises a single-objective microscope with a high-NA (numerical aperture) objective lens for achieving such submicron resolution. The NA can be in the range, for example, of 0.8 to 0.95 for air-immersed samples. The imaging system 104 may have a depth of field of perhaps 2-3 microns as configured, while the distance "S" between layers 114 and 118 can be on the order of 10 microns. However, it is to be appreciated that a wide variety of scenarios and dimensions are within the scope of the present teachings including, but not limited to, nanoimprint lithography scenarios, and other micro-scale or nano-scale fabrication scenarios.

Apparatus 100 further comprises a position control system 110 for positioning the imaging system 104, the upper material layer 114, and/or the lower material layer 118 in accordance with the functionalities described herein. A processor 112 having an associated memory 113 is provided that interacts with the imaging system 104 and position control system 110 in accordance with the functionalities described herein. As indicated by the multiple arrow markers 119 in FIG. 1, the position control system 110 is capable of separately translating each of the imaging system 104, the upper material layer 114, and the lower material layer 118 to desired positions in the x-y plane. As indicated by the multiple vertical translation elements 121 in FIG. 1, the position control system 110 is capable of separately translating each of the imaging system 104, the upper material layer 114, and the lower material layer 118 to desired vertical positions in the z-direction. In one embodiment the position control system 110 is fully motor-driven under control of the processor 112, while in other embodiments manual control capabilities are provided. While shown in FIG. 1 as providing three degrees of freedom in the x, y, and z directions, it is to be appreciated that further degrees of freedom can be provided and controlled according to the embodiments, usually including at least one tilt angle, and in other embodiments including all six possible degrees of freedom. Where movable along the optical axis (e.g., the "z" axis of FIG. 1), the upper and lower material layers 114 and 118 are usually mechanically coupled so as to move in unison therealong to maintain a constant separation distance "S".

Imaging system 104 has a focal plane 106, represented as a dotted line passing through an intersection of a hypothetical cone beam 108, and representing the nominal location at which a planar object should be imaged by the imaging system 104. Generally speaking, depth of field refers to a distance range around the focal plane along the optical axis at which imaging can be achieved within a desired lateral resolution.

Upper layer 114 comprises a feature of interest 116 and lower layer 118 comprises a feature of interest 120. The features of interest 116 and 120 facilitate alignment sensing or control, and/or constitute particular subjects of alignment sensing or control. Feature of interest refers generally to any feature or set of features that can be imaged and that is fixedly associated with a lateral position of its corresponding layer. Many different types of features of interest are within the scope of the present teachings, ranging from alignment markers to native surface patterns. In one embodiment, the upper layer 114 is at least partially translucent at an operating wavelength of the imaging system 104. However, the scope of the present teachings extends to other scenarios as well.

FIG. 2 illustrates alignment sensing according to an embodiment. At step 202, the focal plane 106 is caused to correspond to either the upper layer 114 or lower layer 118, termed herein the first layer. This is achieved by (i) vertically moving (i.e., in the z-direction) the layers 114 and 118, (ii) vertically moving the imaging system 104, (iii) adjusting the imaging system 104 itself to vary a focal distance to the focal plane 106, or any combination of (i)-(iii). At step 204 an image of the first layer including its associated feature of interest is acquired and is stored in the memory 113.

At step 206, the focal plane 106 is caused to correspond to the other of the upper layer 114 or lower layer 118, termed herein the second layer. Again, this is achieved by vertically moving the layers 114 and 118, vertically moving the imaging system 104, and/or adjusting the focal distance or other intrinsic property of the imaging system 104. According to an embodiment, the first layer stays laterally fixed while the second layer is brought into focus. Alternatively, if the upper layer is laterally moved during step 206, mechanical stops (not shown) can be used to precisely remember and restore the lateral position at which the first layer was imaged.

In some embodiments, where the relative size and/or locations of the features need to be preserved, care should be taken not to disturb the apparent size or location of the features during this procedure, that is, any movements required to adjust focus should not disturb the features' ultimate apparent locations or size (e.g., through changes in the magnification). In one embodiment described further infra, compensation is made for such shifting by measurement or other knowledge of the lateral translations or changes to magnification.

At step 208, an image of the second layer is acquired encompassing its associated feature of interest. At step 210, the processor 112 uses the first and second images to automatically compute an alignment between the features of interest on the first and second layers. In one embodiment, the alignment result is expressed as a relative displacement ($x_d$, $y_d$) in Cartesian coordinates, although a variety of other expression types or coordinate systems are within the scope of the present teachings, including expressions relative to an absolute frame of reference. In one embodiment, the first and second images are processed separately. In each image the feature of interest is segmented and its position is determined relative to the imaging system 104, these separate coordinates then being used to determine the relative displacement ($x_d$, $y_d$). In another embodiment the images are combined into a single image, such as by an exclusive-or operation or an addition operation, each feature of interest is segmented, and the relative displacement ($x_d$, $y_d$) is determined directly therefrom. The automated computation of the alignment measurement can be used for a variety of useful purposes, including those described further herein.

In one embodiment, scanning confocal microscopy is used to achieve focusing at multiple levels. One advantage of scanning confocal microscopy is that out-of-focus layers can be completely blocked from the acquired image rather than simply blurred out.

FIG. 3 illustrates alignment sensing and controlling according to an embodiment, wherein an automated positioning system is formed including a combination of the position control system 110 and the processor 112, the automated positioning system being capable of placing the features of interest into a desired alignment. While the desired alignment is often (0,0) in which the features of interest are directly on top of each other, the scope of the present teachings is not so limited, and the desired alignment may generally be any chosen relative offset or absolute position set. For clarity of description and not by way of limitation, a scenario involving a desired relative offset is described herein.

According to an embodiment, steps 302-310 proceed in a manner analogous to steps 202-210 of FIG. 2 to determine an actual alignment between the features of interest. After computation of the actual alignment at step 310, at step 312 this actual alignment is compared to the desired alignment. If the actual alignment does not correspond to the desired alignment within a predetermined tolerance, then at step 314 the second layer is moved toward a position that achieves the desired alignment. Step 308 of acquiring the second image is repeated, and so on until the desired alignment is achieved. In one embodiment the step 308 is not repeated until the full intended motion of the second layer is achieved. In another embodiment the steps 308-312 are repeated constantly during the motion process. Notably, in the embodiment of FIG. 3, it is not necessary to re-image the first layer because the first stored image remains accurate and relevant throughout the process.

Figure 4:
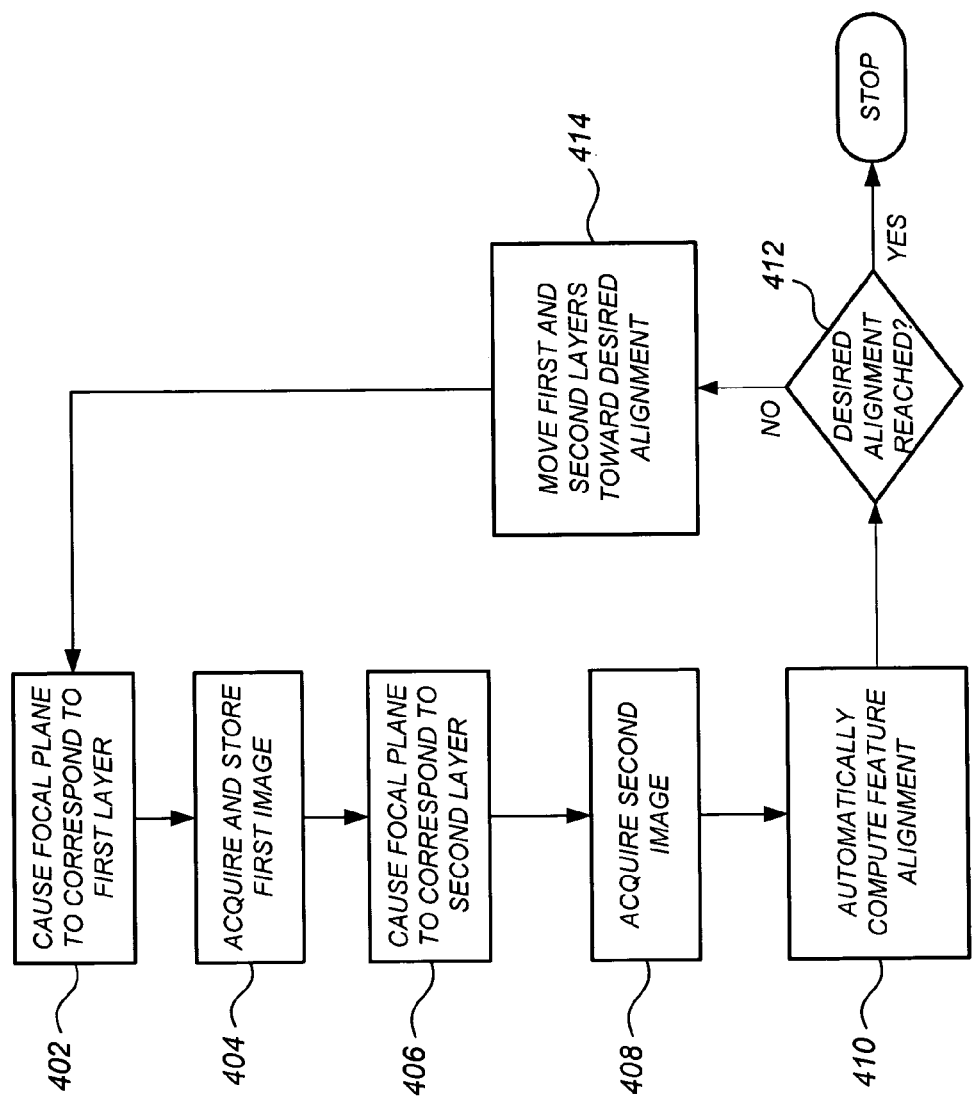
FIG. 4 illustrates alignment sensing and controlling according to an embodiment.

FIG. 4 illustrates alignment sensing and controlling according to an embodiment in which both the first and second layers are moved to achieve the desired alignment. Steps 402-412 proceed in a manner analogous to steps 302-312 of FIG. 3. However, at step 414 both the first and second layers are moved toward positions achieving the desired alignment. Because the first stored image no longer corresponds to the current position of the first layer, the steps 402-412 are repeated in order to properly determine the current alignment, and so on until the desired alignment is achieved.

Figure 5:
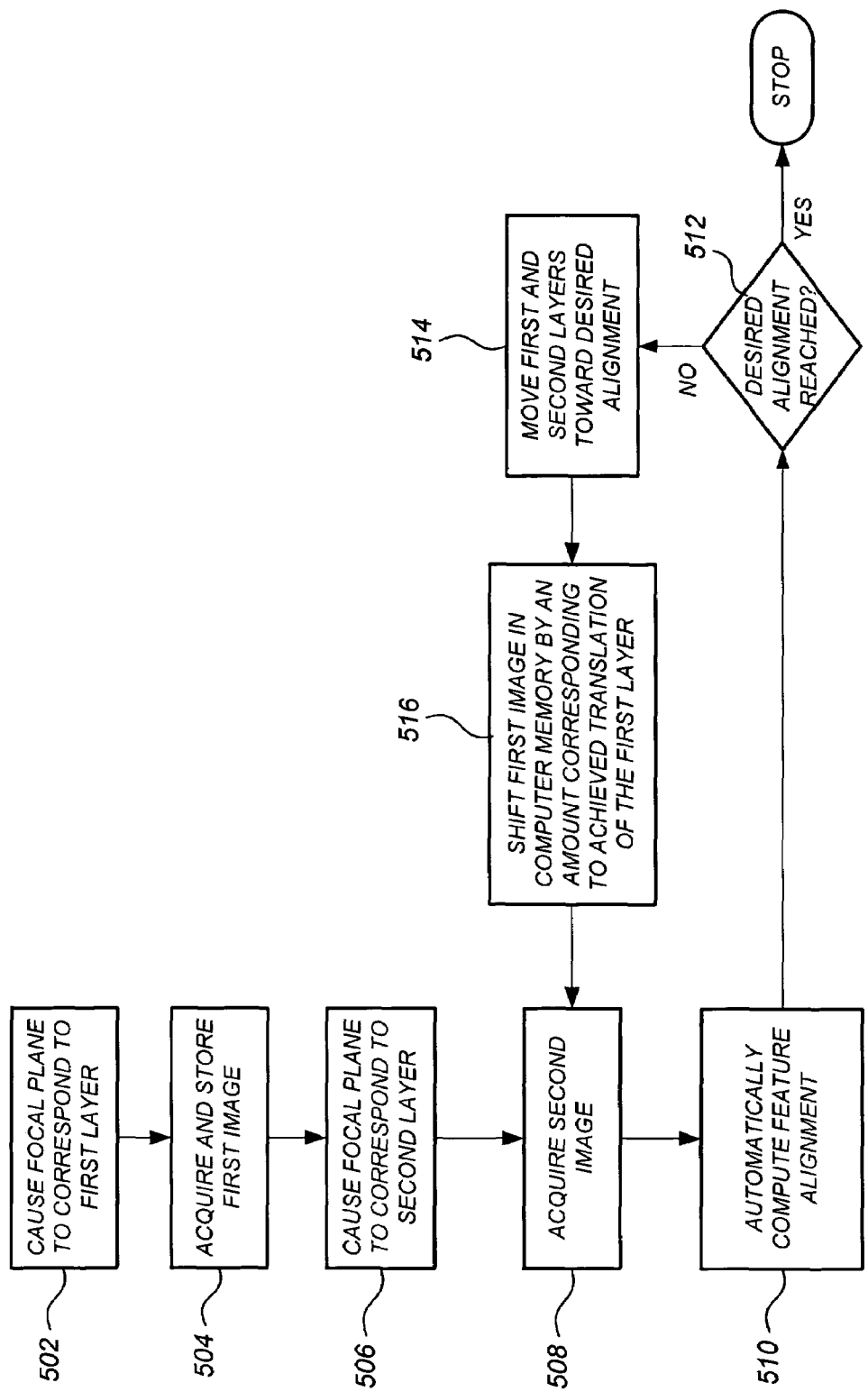
FIG. 5 illustrates alignment sensing and controlling according to an embodiment.

FIG. 5 illustrates alignment sensing and controlling according to an embodiment in which the first stored image is internally shifted so as to maintain a "moving estimate" of the actual position of the feature of interest on the first layer as it is moved, without necessitating a re-focusing and re-imaging process for the first layer. The "moving estimate," i.e., the shifted stored first image, is based on a first, optically-measured position plus a moving offset extrinsically determined using means other than the imaging system 104. By way of example, digital commands sent to stepper motors of the positioning system 110, or measurements from an external interferometer system, can serve as a basis for estimating the achieved translation of the first layer.

According to an embodiment, steps 502-514 proceed in a manner analogous to steps 402-414 of FIG. 4. However, at step 516, the first stored image is internally shifted by an amount corresponding to an achieved translation of the first layer as extrinsically determined, i.e., as determined using means other than imaging system 104 itself. Steps 508-512 are repeated in order to properly determine the current alignment using the shifted stored first image and a newly acquired second image, and so on until the desired alignment is achieved. Notably, re-focusing and re-imaging of the first layer is not required in the embodiment of FIG. 5, thereby at least partially streamlining the alignment sensing process.

Figure 6:
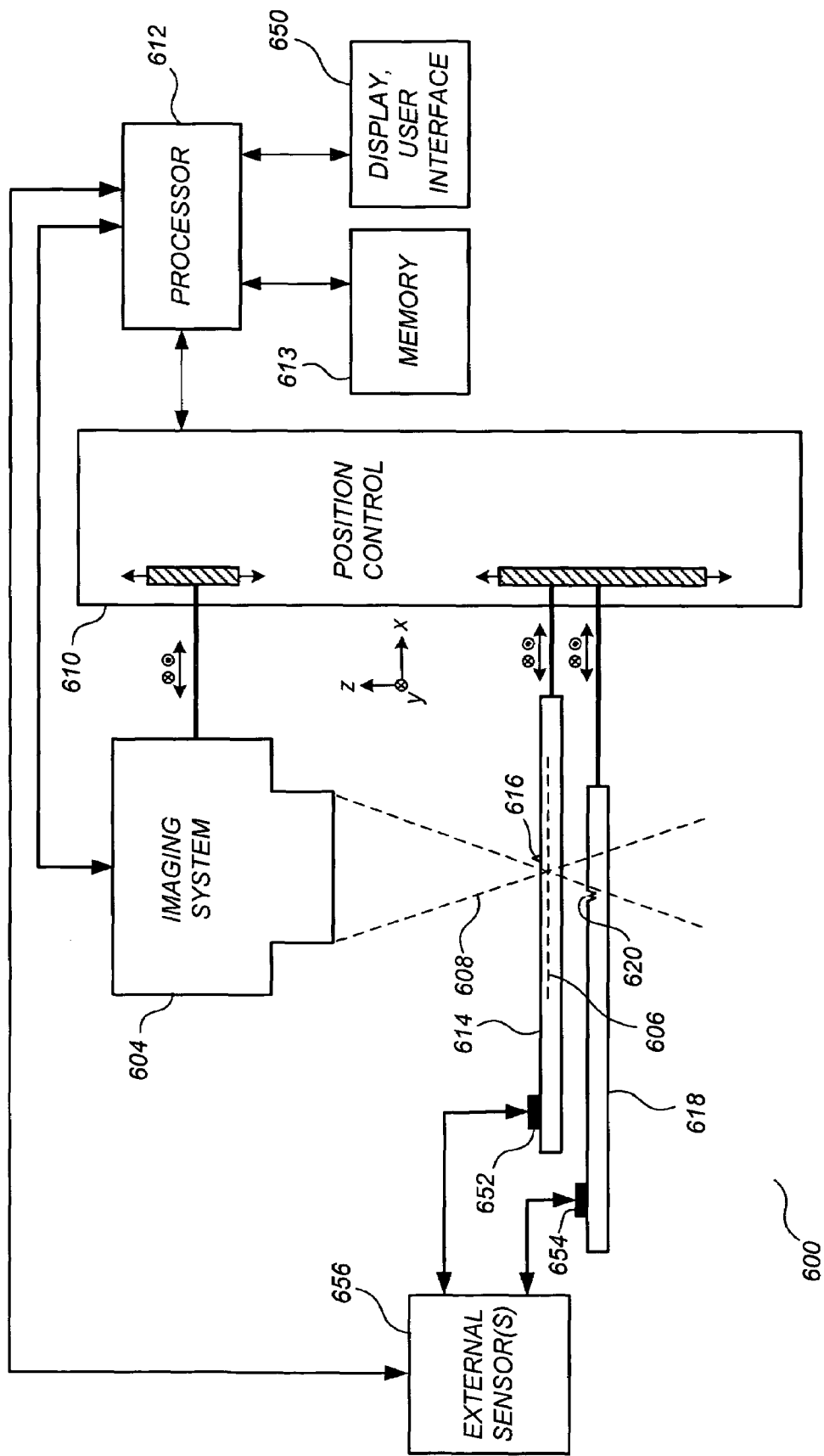
FIG. 6 illustrates an apparatus for at least one of sensing and controlling an alignment of multiple material layers according to an embodiment.

FIG. 6 illustrates an apparatus 600 for at least one of sensing and controlling an alignment of multiple material layers including an upper layer 614 and a lower layer 618 according to an embodiment, the upper layer including a first feature of interest 616 and the lower layer including a second feature of interest 620. Apparatus 600 comprises an imaging system 604 having a focal plane 606, and further comprises a position control system 610, a processor 612 and associated memory 613, a display and user interface 650, and an external sensor 656 coupled as shown in FIG. 6.

External sensor 656, which may comprise multiple sensor elements depending on the property being sensed, is coupled to elements 652 and 654 on the upper layer 614 and lower layer 618, respectively. The elements 652 and 654 can represent sensing ports for any of a variety of combined physical characteristics that can be jointly exhibited by the layers 614 and 618 when considered as a single assembly in their current state of alignment. By way of example, the element 652 may be an upper plate of a capacitor, while the element 654 may be a lower plate of that capacitor, in a nanomachine under construction. Other combined physical characteristics that can be empirically sensed by the external sensor 656 can include electrical resistance, electrical inductance, mutual force, resonant frequency, or a variety of other physical properties that depend, at least on part, on the state of alignment between the upper and lower layers 614 and 618.

It has been found advantageous to include at least one combined physical characteristic as a component and/or end goal of an alignment sensing and control scheme according to an embodiment. One particularly useful implementation occurs in the case of small device elements that may exhibit highly nonlinear or unpredictable characteristics as precise local alignments are changed. In this circumstance, it is useful to start with a measured alignment between the layers and associate that measured alignment with the currently-measured combined physical characteristic. If the combined physical characteristic is not within a desired range, a target alignment more consistent with the desired range is computed and the layers are moved toward that alignment. The process is repeated until a desired result for the combined physical characteristic is obtained.

In an alternative embodiment, a model-based algorithm can be used to estimate the physical characteristic based on the measured alignment, rather than direct empirical measurement. In still another embodiment, a combination of direct empirical measurement and model-based estimation is used to determine the combined physical characteristic.

Figure 7:
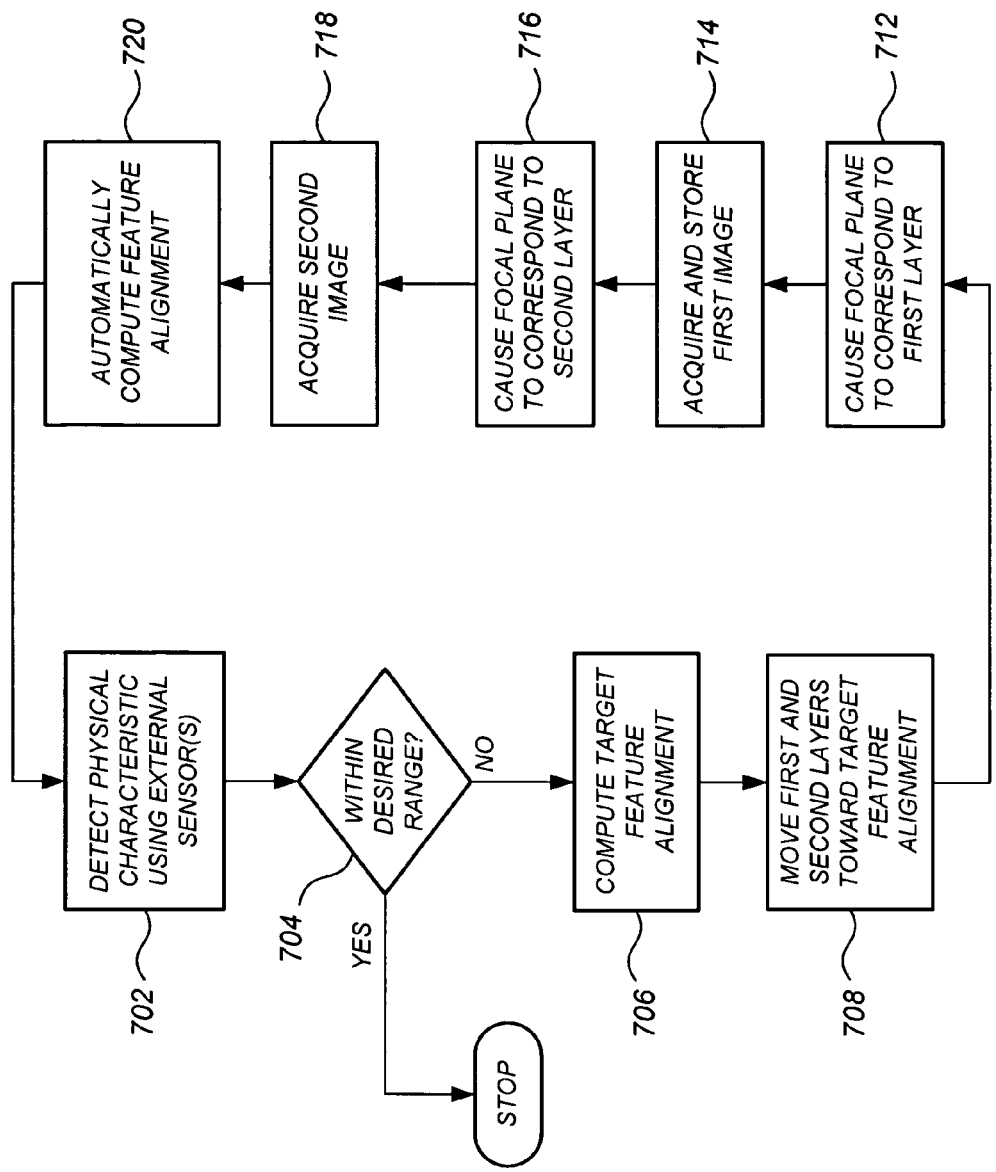
FIG. 7 illustrates alignment sensing and controlling according to an embodiment.

FIG. 7 illustrates alignment sensing and controlling according to an embodiment using the apparatus 600 of FIG. 6. At step 702, the combined physical characteristic in question is detected using the external sensor 656. At step 704 it is determined whether that combined physical characteristic is within a desired range and, if not, a target feature alignment is computed at step 706. At step 708, the first and second layers are moved toward that target feature alignment, and then steps 712-720 are carried out in a manner analogous to steps 202-210, respectively, of FIG. 2. In other embodiments, only the second layer is moved instead of both layers (see FIG. 3). In still other embodiments, both layers can be moved but a "moving estimate" of the stored first image (see FIG. 5) is used to expedite the alignment determination process. In another embodiment, as an alternative to step 720 or in conjunction therewith, a viewable combined image comprising the first and second images is displayed on the display/user interface 650 for viewing by a human, who can visually determine the alignment state and optionally instantiate manual manipulation of the relative displacements if desired.

Figure 8:
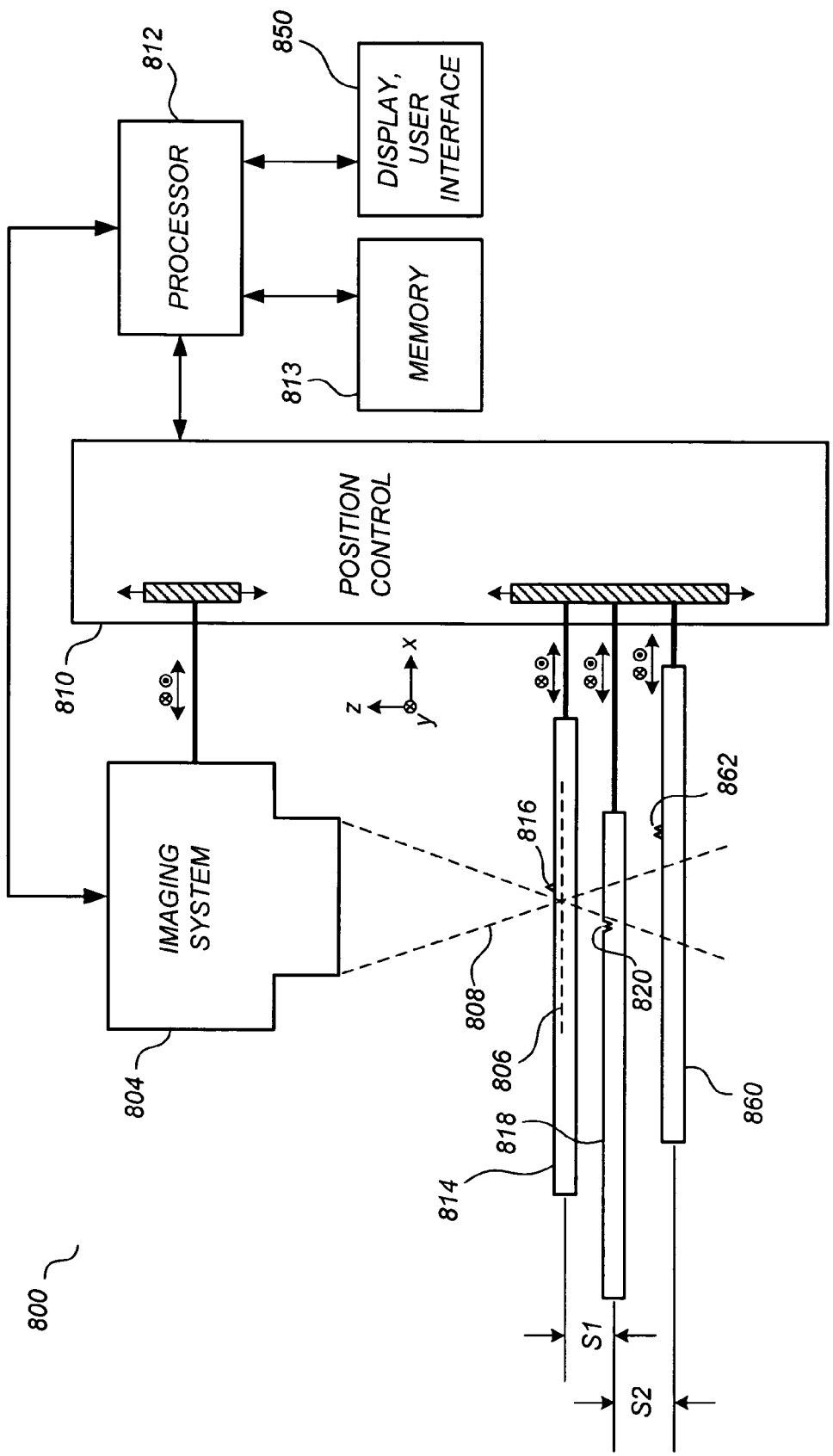
FIG. 8 illustrates an apparatus for at least one of sensing and controlling an alignment of multiple material layers according to an embodiment.

FIG. 8 illustrates an apparatus 800 for at least one of sensing and controlling an alignment of multiple material layers including an upper layer 814, a middle layer 818, and a lower layer 860, the upper layer 814 including a first feature of interest 816, the middle layer 818 including a second feature of interest 820, and the lower layer 860 including a third feature of interest 862. Apparatus 800 comprises an imaging system 804 having a focal plane 806, a position control system 810, a processor 812 and associated memory 813, and a display and user interface 850. At least one of the distances S1 and S2 between layers is greater than a depth of field of the imaging system 804. In another embodiment (not shown), the apparatus 800 further includes external sensors similar to the external sensors 656 of FIG. 6, as well as sensing ports on each of the three layers 814, 818, and 860 for achieving an empirical sensing of a combined physical characteristic of all three layers as part of an alignment sensing and control process according to an embodiment.

Figure 9:
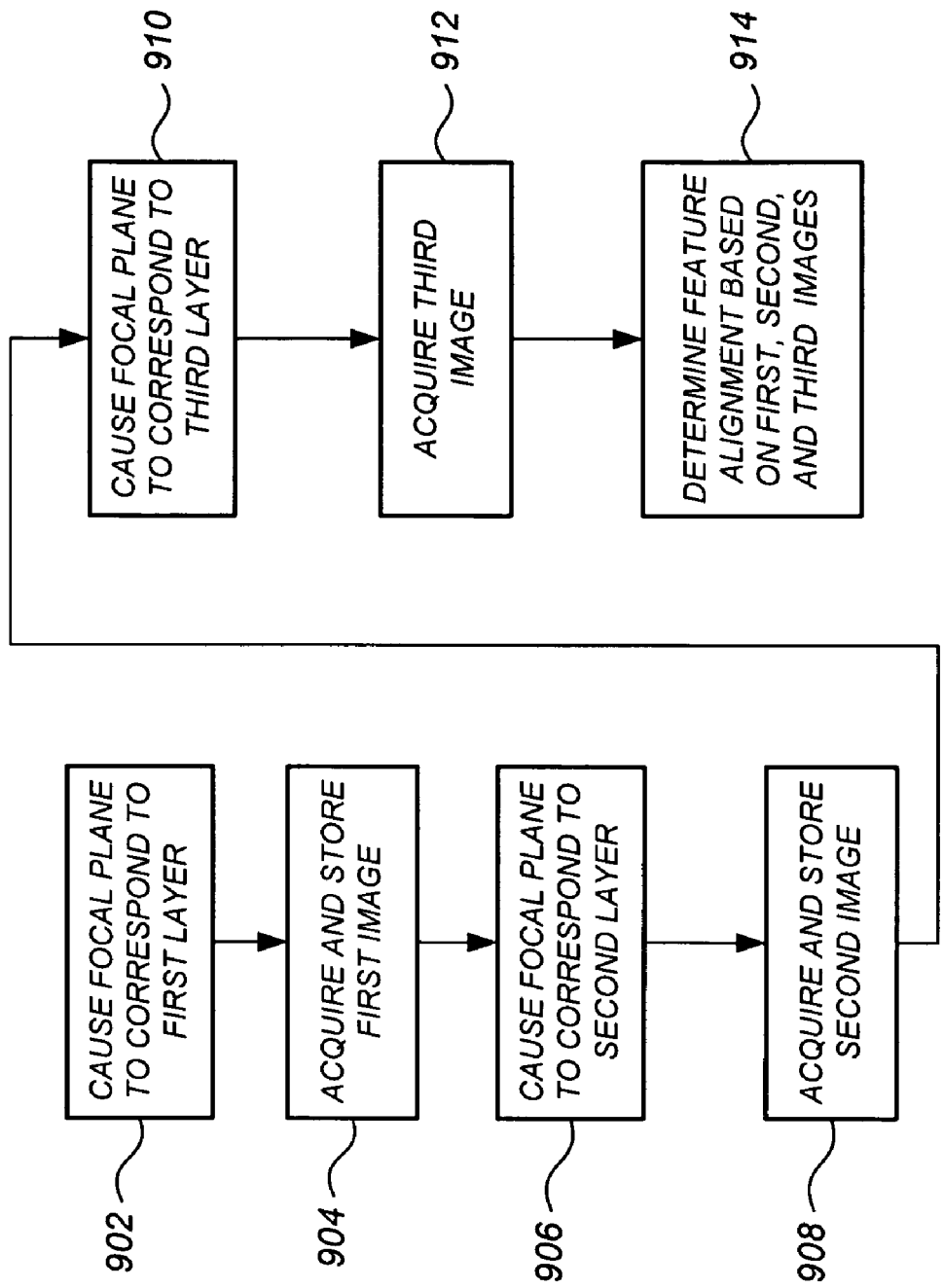
FIG. 9 illustrates alignment sensing according to an embodiment.

FIG. 9 illustrates alignment sensing according to an embodiment. At step 902, the focal plane 806 is caused to correspond to a first layer, i.e., one of the three material layers 814, 818, or 860. An image of the first layer including its associated feature of interest is acquired and, at step 904, is stored in the memory 813. At step 906, the focal plane 806 is caused to correspond to a second layer, i.e., one of the other two layers. An image of the second layer including its associated feature of interest is acquired and, at step 908, is stored in the memory 813. At step 910, the focal plane 806 is caused to correspond to a third layer, i.e., the remaining layer and, at step 912, a third image is acquired. At step 914, the processor 812 automatically computes alignment among the features of interest on the first, second, and third layers by processing the first, second, and third images. In one embodiment, the alignment result is expressed as a pair of relative displacements $(x_{d12}, y_{d12})$ and $(x_{d23}, y_{d23})$ in Cartesian coordinates, although a variety of other expression types or coordinate systems are within the scope of the present teachings, including expressions relative to an absolute frame of reference. In another embodiment, as an alternative to step 914 or in conjunction therewith, a viewable combined image comprising the first, second, and third images is displayed on the display/user interface 850 for viewing by a human, who can visually determine the alignment state and optionally instantiate manual manipulation of the relative displacements if desired.

The features and advantages of automated position sensing and/or controlling described supra in relation to two material layers become especially powerful when, in accordance with an embodiment, they are implemented in the context of three or more material layers. By way of example, in one embodiment there is determined at least one combined physical characteristic of the first, second, and third material layers at their current alignment state. If the combined physical characteristic does not fall within a desired range, then new target alignments more closely associated with obtaining that desired range are computed. A positioning system moves the three material layers toward the target alignment, and then the new alignment is automatically computed using, for example, the steps of FIG. 9. The combined physical characteristic is re-determined and, if again not within the said desired range, new target alignments are again recomputed based on the current alignment and the value of the current combined physical characteristic. The positioning system again moves the three material layers toward the target alignment condition, and so on until the desired range for the combined physical characteristic is achieved. This can be especially useful in the context of building microstructures or nanomachines having components with unpredictable behaviors highly sensitive to alignment conditions. In an alternative embodiment, a model-based algorithm can be used to estimate the combined physical characteristic of the three material layers based on the measured alignment, rather than direct empirical measurement. In still another embodiment, a combination of direct empirical measurement and model-based estimation is used to determine the combined physical characteristic.

It is to be appreciated that embodiments involving more than three layers are also within the scope of the present teachings. It is to be further appreciated that the present teachings are widely applicable in a variety of physical circumstances in which at least one of alignment sensing and control is desired but for which an imaging system has limited depth of field relative to a distance separating the items to be positioned along the optical axis of the imaging system. Examples include contact lithography, proximity lithography, nanoimprint lithography, or any of a variety of other processes relating to the fabrication or use of very small devices. In one embodiment, the upper layer 814 may be an upper mold, the lower layer 860 may be a lower mold, and the middle layer 818 may be a substrate requiring dual-sided molding in a nanofabrication process involving nanoimprint lithography.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, without departing from the scope of the present teachings, effective translucence relative to the imaging system can be achieved for an upper opaque layer by temporarily moving that layer out of the way while imaging a layer underneath, with mechanical stops being used as a temporary memory means for maintaining precise lateral positioning of the opaque layer. Thus, reference to the details of the described embodiments are not intended to limit their scope.

What is claimed is:

1. A method for using an imaging system in relation to a plurality of material layers having different depths relative to the imaging system, comprising:
   causing a focal plane of the imaging system to correspond to a first of said plurality of material layers, and acquiring and storing a first image including at least a portion of the first material layer having a first feature of interest thereon;
   causing said focal plane to change to correspond to a second of said plurality of material layers and acquiring a second image including at least a portion of the second material layer having a second feature of interest thereon;
   processing said first and second images using a processor to automatically compute a vertical alignment measurement between said first and second features of interest; and
   using the alignment measurement to move at least one of the first and second layers relative to the other layer to bring the first and second layers into vertical alignment with each other,
   wherein said plurality of material layers have different depths relative to the imaging system.

2. The method of claim 1, wherein using the alignment measurement includes providing said alignment measurement to a positioning system, said positioning system moving said second material layer toward a desired vertical alignment between said first and second features of interest; re-acquiring said second image including said portion of the second material layer having said second feature of interest thereon; processing the re-acquired second image to automatically recompute said alignment measurement; and repeating said providing, said re-acquiring, and said processing the re-acquired second image until said desired alignment is achieved.

3. The method of claim 1 wherein using the alignment measurement includes providing said alignment measurement to a first positioning system and a second positioning system, said first and second positioning systems moving said first and second material layers, respectively, toward a desired vertical alignment between said first and second features of interest; re-acquiring said second image including said portion of the second material layer having said second feature of interest thereon; shifting in computer memory said stored first image by an amount corresponding to a degree of movement achieved by said first positioning system; processing the shifted stored first image and the re-acquired second image to automatically recompute said alignment measurement; and repeating said providing, said re-acquiring, said shifting, and said processing the shifted stored first image until said desired alignment is achieved.

4. The method of claim 1, further comprising: determining at least one physical characteristic of an assembly comprising said first and second material layers at said alignment measurement; determining whether said at least one physical characteristic falls within a desired range for that physical characteristic and, if not, computing a target alignment between said first and second features of interest more closely associated with obtaining said desired range for that physical characteristic.

5. The method of claim 4, wherein said determining at least one physical characteristic comprises taking an empirical measurement of at least one property of said assembly at said alignment measurement.

6. The method of claim 4, wherein using the alignment measurement includes providing said alignment measurement to a positioning system, said positioning system moving said second material layer toward said target alignment; re-acquiring said second image including said portion of the second material layer having said second feature of interest thereon; processing the re-acquired second image to automatically recompute said alignment measurement; re-determining said at least one physical characteristic and whether said at least one physical characteristic falls within said desired range and, if not, re-computing said target alignment; and repeating said providing, said re-acquiring, said processing the re-acquired second image, and said re-determining until said at least one physical characteristic falls within said desired range.

7. The method of claim 2, said alignment measurement being a first alignment measurement, further comprising: storing said second image; causing said focal plane to correspond to a third of said plurality of material layers and acquiring a third image including at least a portion of the third material layer having a third feature of interest thereon; and processing said third image to automatically compute a second alignment measurement between said third feature of interest and at least one of said first and second features of interest, respectively.

8. The method of claim 7, further comprising: providing said second alignment measurement to a positioning system, said positioning system moving said third material layer toward a desired second alignment; re-acquiring said third image including said portion of the third material layer having said third feature of interest thereon; processing the re-acquired third image to automatically recompute said second alignment measurement; and repeating said providing, re-acquiring, and processing the re-acquired third image until said desired second alignment is achieved.

9. The method of claim 1, wherein said first and second material layers are vertically separated and wherein the layers are moved into vertical alignment such that one feature is on top of the other feature.

10. The method of claim 1, wherein said causing said focal plane to correspond to the second material layer is performed using at least one of moving said first and second material layers toward said imaging system while said imaging system is held stationary, moving said imaging system toward said first and second material layers while said first and second layers are held stationary, concurrently moving said imaging system and said first and second material layers toward each other, and altering a focal distance of the imaging system.

11. The method of claim 10, wherein said causing the focal plane of the imaging system to correspond to the second material layer is further performed according to a feedback control system sensing an maximum degree of achieved focus as a relative position of said second material layer and said focal plane are adjusted along an optical axis of the imaging system.

12. A method for using an imaging system in relation to a plurality of material layers vertically separated by a distance greater than a depth of field of the imaging system, comprising:

causing a focal plane of the imaging system to correspond to a first of said plurality of material layers, and acquiring and storing a first image including at least a portion of the first material layer having a first feature of interest thereon;

causing said focal plane to correspond to a second of said plurality of material layers, and acquiring and storing a second image including at least a portion of the second material layer having a second feature of interest thereon;

causing said focal plane to correspond to a third of said plurality of material layers and acquiring a third image including at least a portion of the third material layer having a third feature of interest thereon;

processing said first, second, and third images by using a processor to determine a first alignment state between said first feature of interest and said second feature of interest and a second vertical alignment state between said second feature of interest and said third feature of interest; and using the vertical alignment states to laterally move the layers such that the first, second and third features are on top of each other, wherein said plurality of material layers have different depths relative to the imaging system.

13. The method of claim 12, further comprising: displaying a combination of said first, second, and third images on a user display; and visually determining said first and second alignment states based on said displayed combination.

14. The method of claim 12, further comprising automatically computing first and second alignment measurements corresponding to said first and second alignment states based on said first, second, and third images.

15. The method of claim 14, further comprising:

providing said first and second alignment measurements to first, second, and third positioning systems, respectively, said first, second, and third positioning systems moving said first, second, and third material layers toward desired first and second alignment measurements, respectively;

causing said focal plane to correspond to the first material layer and re-acquiring and re-storing the first image;

causing said focal plane to correspond to the second material layer and re-acquiring and re-storing the second image;

causing the focal plane to correspond to the third material layer and re-acquiring the third image; and processing the re-stored first image, the re-stored second image, and the re-acquired third image to automatically re-compute said first and second alignment measurements; and repeating said providing, said causing said focal plane to correspond to the first material layer, said causing said focal plane to correspond to the second material layer, said causing the focal plane to correspond to the third material layer, and said processing the re-stored first image until said desired first and second alignment measurements are achieved.

16. The method of claim 14, further comprising:

determining at least one physical characteristic of a combination of said first, second, and third material layers at said first and second alignment measurements;

determining whether said at least one physical characteristic falls within a desired range for that physical characteristic and, if not, computing first and second target alignments measurements more closely associated with obtaining said desired range for that physical characteristic.

17. The method of claim 16, wherein said determining at least one physical characteristic includes an empirical measurement of at least one property of said combination at said first and second alignment measurements.

18. The method of claim 16, further comprising:
providing said first and second alignment measurements to first, second, and third positioning systems, respectively, said first, second, and third positioning systems moving said first, second, and third material layers toward said target first and second alignment measurements, respectively;
causing the focal plane to correspond to the first material layer and re-acquiring and re-storing the first image;
causing the focal plane to correspond to the second material layer and re-acquiring and re-storing the second image;
causing the focal plane to correspond to the third material layer and re-acquiring the third image;
processing the re-stored first image, the re-stored second image, and the re-acquired third image to automatically re-compute said first and second alignment measurements;
re-determining said at least one physical characteristic and whether said at least one physical characteristic falls within said desired range and, if not, re-computing said first and second target alignments; and
repeating said providing, said causing the focal plane to correspond to the first material layer, said causing said focal plane to correspond to the second material layer, said causing the focal plane to correspond to the third material layer, said processing the re-stored first image, and said re-determining until said at least one physical characteristic falls within said desired range.

19. An apparatus for facilitating lateral positioning of first and second material layers that are vertically spaced apart, the first layer having a first feature of interest and the second layer having a second feature of interest, the apparatus comprising:
an imaging system having a focal plane and having a depth of field less than a vertical spacing between the first and second layer, the imaging system for acquiring a first image with its focal plane at the first material layer and for acquiring a second image with its focal plane at the second material layer; and
a processor for processing said first and second images to automatically compute a vertical alignment state between said first and second features of interest and
a positioning mechanism for using the vertical alignment state to move at least one of the layers laterally and bring the first and second layers into vertical alignment with each other.

20. The apparatus of claim 19, said alignment state being a first alignment state, said plurality of layers including a third layer having a third feature of interest, said memory storing a third image acquired by said imaging system with said focal plane substantially coincident with the third layer, said processor processing said third image to automatically compute a second vertical alignment state between said third feature of interest and at least one of said first and second features of interest.

21. The apparatus of claim 19, wherein the positioning mechanism is configured to laterally translate at least one of said first and second layers to affect said alignment state therebetween, said positioning mechanism translating at least one of said first and second layers toward a desired alignment state therebetween, said processor receiving a re-acquired second image and processing said re-acquired second image to re-determine said alignment state, wherein said translating and said receiving and processing are repeated until said alignment state reaches said desired alignment.

22. The apparatus of claim 19, said processor determining at least one combined physical characteristic of said first and second layers having said alignment state, said processor further determining whether said combined physical characteristic falls within a desired range therefor and, if not, computing a target alignment state more closely associated with obtaining said desired range for said combined physical characteristic.

23. The apparatus of claim 22, wherein said combined physical characteristic is based at least in part upon an empirical measurement taken while said first and second layers are in said alignment state.

24. The apparatus of claim 22, wherein said combined physical characteristic is based at least in part upon a model of a device including models of said first and second layers in said alignment state.

25. The apparatus of claim 22, wherein the positioning mechanism is configured to laterally translate at least one of said first and second layers to affect said alignment state therebetween, wherein: said positioning mechanism translates at least one of said first and second layers toward said target alignment; said processor receives a re-acquired second image and processes said re-acquired second image to re-determine said alignment state; said processor determines at least one combined physical characteristic of said first and second layers having said re-determined alignment state, said processor further determining whether said combined physical characteristic falls within a desired range therefor and, if not, re-computing the target alignment more closely associated with obtaining said desired range for said combined physical characteristic; and wherein said translating, said receiving and processing, and said determining are repeated until said combined physical characteristic falls within said desired range.

26. An apparatus for facilitating lateral alignment of at least three material layers, comprising:
means for separately imaging each of said material layers, said material layers being vertically spaced apart along an optical axis of the means for separately imaging, said means for separately imaging having a depth of field less than a spacing between at least two of said material layers, said means for separately imaging being configured to separately bring each material layer into focus to image that material layer;
means for determining a lateral alignment of a third feature of interest on a third of said material layers with at least one of said first and second features of interest, comprising:
means for comparing said third image to at least one of said first and second images to determine said lateral alignment of said third feature of interest with at least one of said first and second features of interest; and
means for changing relative lateral positions of the three layers so their features of interest are in overlapping alignment.

27. The apparatus of claim 26, wherein said means for jointly comparing comprises means for displaying a combination of said first, second, and third images to a user, wherein a visual alignment determination based on said display can be made.

28. The apparatus of claim 27, wherein said means for jointly comparing comprises a processor configured to automatically compute said lateral alignment based on said third image and at least one of said first and second images.

29. The apparatus of claim 28, wherein the positioning means positions said first, second, and third layers toward a desired overall alignment among said first, second, and third features of interest, wherein said means for separately imaging re-images said first and second layers, wherein said means for separately imaging re-images said third layer, and wherein said processor automatically re-computes said lateral alignment based on said first, second, and third images.

30. The apparatus of claim 28, wherein said first, second, and third features of interest form an actual alignment characteristic, further comprising:
   means for determining at least one combined physical characteristic of said first, second, and third material layers having said actual alignment characteristic; and
   means for determining whether said at least one combined physical characteristic falls within a desired range for that combined physical characteristic and, if not, computing a target alignment characteristic more closely associated with obtaining said desired range for that combined physical characteristic.

31. The apparatus of claim 30, wherein said means for determining at least one combined physical characteristic includes means for taking an empirical measurement.

32. The apparatus of claim 31, wherein said empirical measurement is selected from the group consisting of: electrical resistance, electrical capacitance, electrical inductance, mutual force, and resonant frequency.

33. The apparatus of claim 30,
   wherein said positioning means adjusts the lateral positions of said first, second, and third layers toward said target alignment characteristic; said means for separately imaging re-images said first and second layers; said means for separately imaging re-images said third layer; said processor automatically re-computes said actual alignment characteristic based on said first, second, and third images; said processor determines said at least one combined physical characteristic and determines whether said combined physical characteristic falls within the desired range therefor and, if not, said processor re-computes the target alignment characteristic more closely associated with obtaining said desired range for said combined physical characteristic; and wherein said adjusting, said re-imaging said first and second layers, said re-imaging said third layer, said re-computing, and said determining are repeated until said combined physical characteristic falls within said desired range.

* * * * *

UNITED STATES PATENT AND TRADEMARK OFFICE
CERTIFICATE OF CORRECTION

| | | |
|---|---|---|
| PATENT NO. | : 7,650,029 B2 | Page 1 of 1 |
| APPLICATION NO. | : 10/995840 | |
| DATED | : January 19, 2010 | |
| INVENTOR(S) | : Carl E. Picciotto et al. | |

It is certified that error appears in the above-identified patent and that said Letters Patent is hereby corrected as shown below:

In column 9, line 52, in Claim 11, delete "an maximum" and insert -- a maximum --, therefor.

In column 11, line 64, in Claim 21, delete "arc" and insert -- are --, therefor.

Signed and Sealed this

Sixth Day of July, 2010

David J. Kappos
*Director of the United States Patent and Trademark Office*